United States Patent [19]  
Morrison, Jr.

[11] 4,180,450  
[45] Dec. 25, 1979

[54] PLANAR MAGNETRON SPUTTERING DEVICE

[75] Inventor: Charles F. Morrison, Jr., Boulder, Colo.

[73] Assignee: Vac-Tec Systems, Inc., Boulder, Colo.

[21] Appl. No.: 946,370

[22] Filed: Sep. 27, 1978

Related U.S. Application Data

[63] Continuation-in-part of Ser. No. 935,358, Aug. 21, 1978.

[51] Int. Cl.² .............................................. C23C 15/00
[52] U.S. Cl. .................................. 204/298; 204/192 R
[58] Field of Search ................ 204/192 R, 192 C, 298

[56] References Cited
U.S. PATENT DOCUMENTS

| 3,878,085 | 4/1975 | Corbani | 204/298 |
| 3,956,093 | 5/1976 | McLeod | 204/192 |
| 4,060,470 | 11/1977 | Clarke | 204/192 R |
| 4,100,055 | 7/1978 | Rainey | 204/298 |
| 4,116,806 | 9/1978 | Love et al. | 204/298 |

*Primary Examiner*—Aaron Weisstuch
*Attorney, Agent, or Firm*—Gerald J. Ferguson, Jr.; Joseph J. Baker

[57] ABSTRACT

In a planar magnetron sputtering device including a cathode of target material having a planar sputtering surface, at least a portion of which is disposed about a center line perpendicular to said surface, an anode adapted for establishing an accelerating electric field between the anode and cathode, and magnetic means for establishing a magnetic field adjacent the planar sputtering surface of the cathode for lengthening the path traveled by electrons removed from said cathode, and wherein the lines of force of the magnetic field extend over the sputtering surface of said cathode and pass through the cathode in the vicinity of the center line, the improvement where the magnetic means includes first magnet means for causing a majority of the magnetic lines of force to pass through the cathode in the vicinity of the center line at angles of 45° or less with respect to its planar sputtering surface to thereby enhance the uniformity of cathode erosion and where the magnetic means includes further magnet means for causing the magnetic lines of force to be substantially perpendicular to the sputtering surface of the cathode at its approximate periphery.

30 Claims, 22 Drawing Figures

FIG. 5
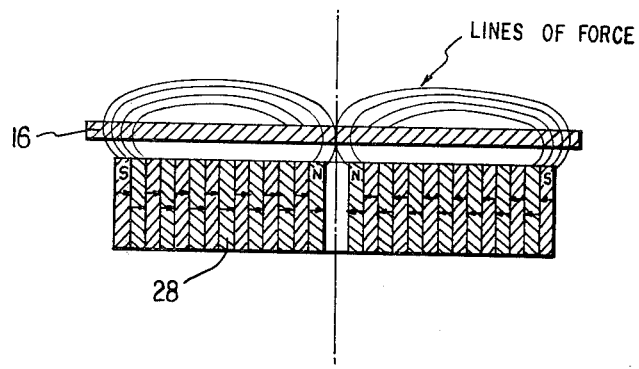
FIG. 6
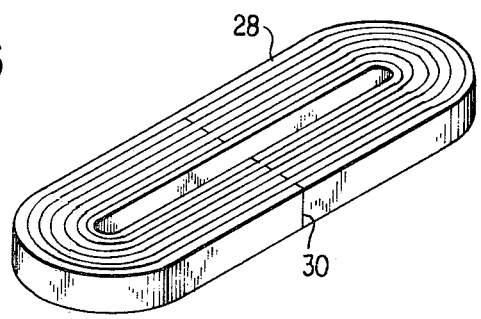
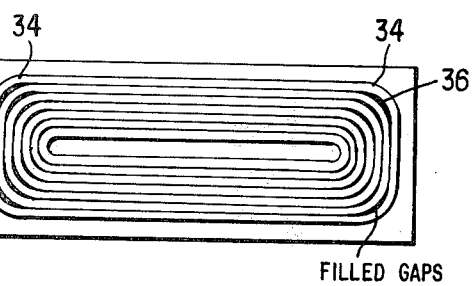
FILLED GAPS
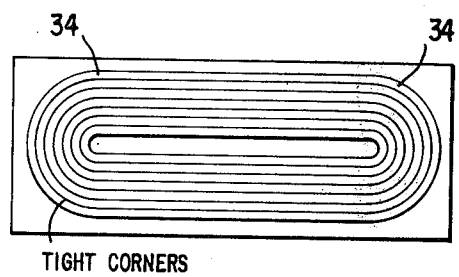
TIGHT CORNERS
FIG. 7 FIG. 8
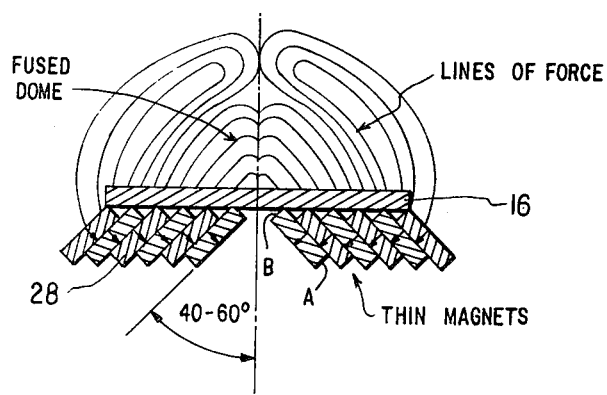
FIG. 9

FIG. 15
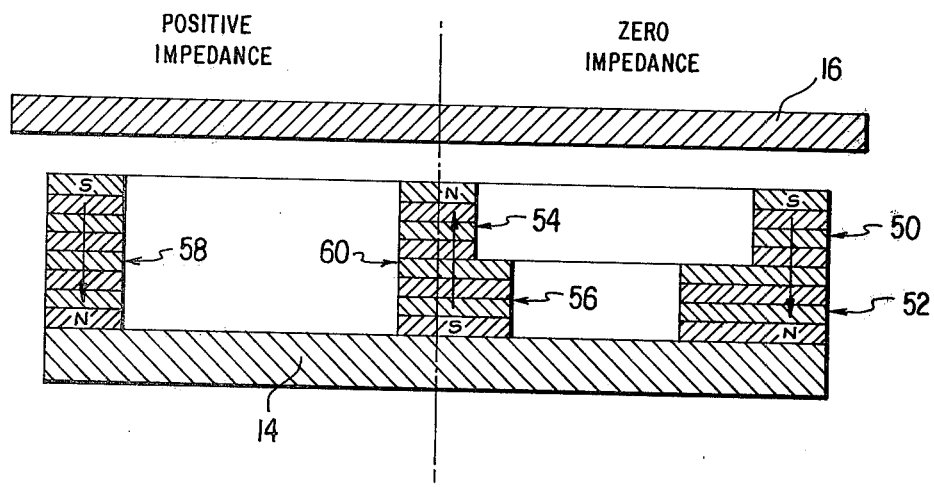
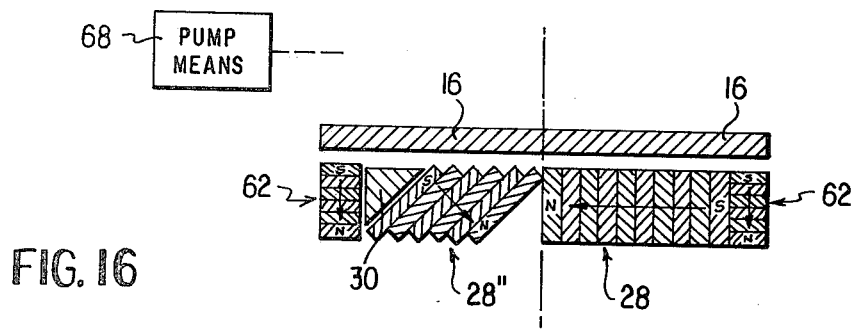
FIG. 16
FIG. 17
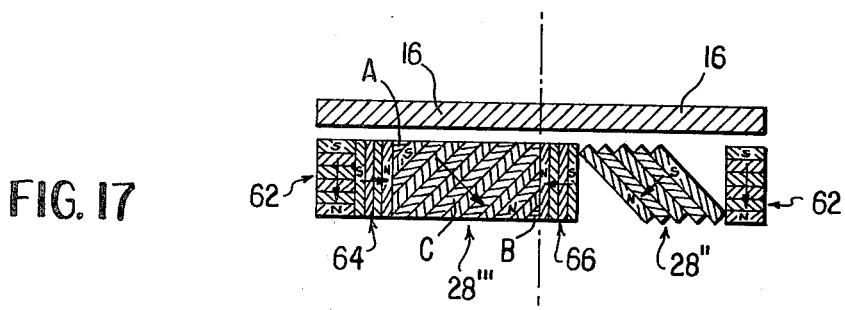

PLANAR MAGNETRON SPUTTERING DEVICE

RELATED APPLICATION

This application is a continuation-in-part of co-pending U.S. Application Serial No. 935,358 filed Aug. 21, 1978 by the present applicant, Charles F. Morrison, Jr.

BACKGROUND OF THE INVENTION

1. Field of the Invention

This invention relates to planar magnetron sputtering devices.

2. Discussion of Prior Art

FIGS. 1 and 2 are cross-sectional and perspective views respectively of a representative prior art planar magnetron sputtering device comprising inner magnet 10 and outer magnet 12 (both of which usually comprise a number of sections) where the magnets are shunted by an iron pole plate 14. Disposed above the magnetic structure is a cathode or target 16 (not shown in FIG. 2). The magnetic lines of force are as shown in FIG. 1 where they exit from and return through cathode 16, a similar technique being employed in U.S. Pat. No. 3,878,085 where the magnetic lines also enter and exit from the cathode surface.

An electric field is established between (a) a ring-like anode 17, which may be disposed around and spaced from cathode 16, (or the chamber wall may serve this function) and (b) the cathode whereby electrons are removed from the cathode. Due to the configuration of the lines of magnetic force (the illustration of which is approximate), the removed electrons tend to concentrate in regions A where the lines of force are substantially parallel to the upper surface of target 16. There the electrons ionize gas particles which are then accelerated to the target to dislodge atoms of the target material. The dislodged target material then typically deposits as a coating film on an object to be coated. Assuming the object to be coated is in strip form or is mounted on a strip moving in the direction of the arrow shown in FIG. 2, the object will be uniformly coated, the strip being narrower in width than the length of the sputtering device.

Once the ionizing electrons are removed from the target, they travel long paths because they circulate in a closed loop defined between inner magnet 10 and outer magnet 12, the loop being above target 16. Hence, the electrons are effective in ionizing the gas particles. However, since most of the ionizing electrons are concentrated in regions A, the ionized gas particles will mainly erode cathode 16 in regions A'. Such uneven disintegration of the target is undesirable in that the target materials are most often extremely pure and accordingly, very expensive.

Another prior art arrangement is shown in cross-section in FIG. 3 where parallel magnets 18 and 20 are employed with pole pieces 22 and 24. However, this configuration is essentially the same as that of FIGS. 1 and 2 in its function and is subject to the same shortcomings.

SUMMARY OF THE INVENTION

It is an important object of this invention to provide an improved planar magnetron sputtering device wherein the target is more uniformly disintegrated.

It is a further object of this invention to provide an improved planar magnetron sputtering device of small dimensions and high power output.

It is a further object of this invention to provide improved planar sputtering devices which are stable at very low pressures and which have an I-E characteristic that exhibits a zero dynamic impedance.

Other objects and advantages of this invention will be apparent from a reading of the following specification and claims taken with the drawing.

BRIEF DESCRIPTION OF THE DRAWING

FIG. 5 is a cross-sectional view of an illustrative magnetic structure in accordance with a preferred embodiment of the invention.

FIG. 6 is a perspective view of an illustrative stacked, flexible magnetic tape for implementing the structure of FIG. 5.

FIGS. 7 and 8 are plan views of stacked magnetic structures illustrating different corner arrangements thereof.

FIGS. 9 and 10 are cross-sectional views of illustrative embodiments of further, preferred magnetic structures in accordance with the invention.

FIG. 15 is a cross-sectional view where the right side portion thereof is an illustrative embodiment of a further, preferred magnetic structure in accordance with the invention and the left side portion thereof is a modified embodiment of the prior art structure illustrated in FIG. 1.

FIGS. 16 and 17 are cross-sectional views of illustrative embodiments of further, preferred magnetic structures in accordance with the invention where the left and right side portions of each Figure illustrate a particular embodiment of the invention.

DETAILED DESCRIPTION OF THE DIFFERENT EMBODIMENTS OF THE INVENTION

Figure 1:
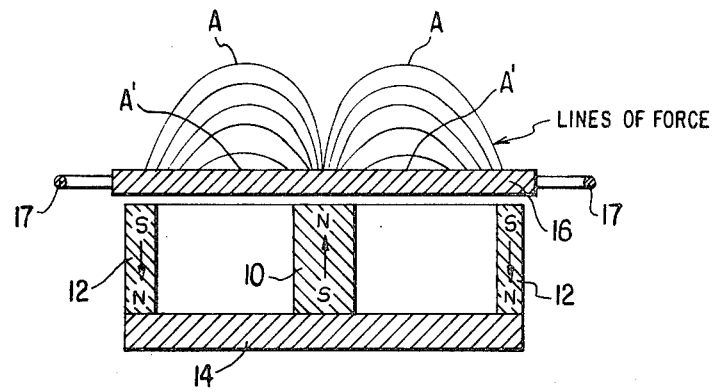
FIGS. 1 and 2 are cross-sectional and perspective views respectively of a prior art planar magnetron sputtering device.

Reference should be made to the drawing where like numerals refer to like parts.

Figure 4:
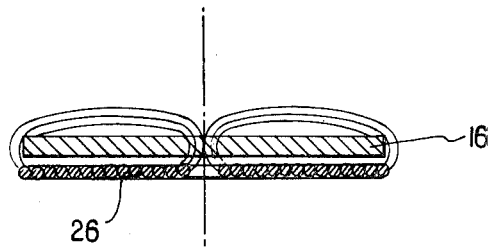
FIG. 4 is a cross-sectional view of an illustrative magnetic structure in accordance with a presently, non-preferred embodiment of the invention.

In FIG. 4 there is illustrated a magnetic structure comprising a flat coil solenoid 26 which was tested in an attempt to provide a magnetic flux which was more uniformly parallel to the surface of the target 16 than that provided by the FIG. 1 structure. As indicated hereinbefore with respect to FIG. 1, disintegration of the cathode predominantly occurs where the lines of force are substantially parallel to the cathode surface— that is, at regions A'. However, the area over which the lines of force are substantially parallel is rather minimal and thus uneconomical utilization of the cathode results. The FIG. 4 embodiment did generate a desired type of parallel field (the illustration of which is approximate), but the ampereturns required to generate sufficient magnetic flux (typically over 100 gauss at ½ inch above the coil) was very high. Accordingly, the flat coil solenoid of FIG. 4 is not considered to be a preferred embodiment of the invention at this time.

Figure 2:
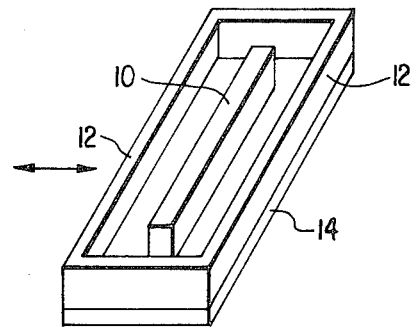
Figure 3:
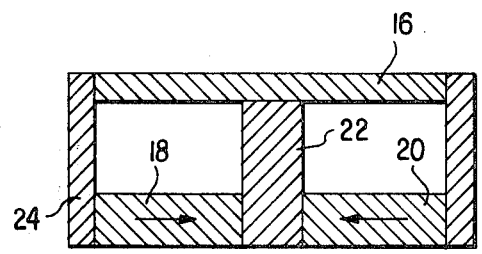
FIG. 3 is a cross-sectional view of another prior art device.

Referring to FIGS. 5 and 6, there is shown an illustrative permanent magnet structure which functionally approximates the FIG. 2 structure, where again the illustrative field is approximate. The structure comprises a plurality of flexible magnetic tapes 28 which are concentrically arranged or stacked to form a flat coil as shown in FIG. 6. Each ring of the coil comprises a strip of the tape where the ends of each strip abut one another as indicated at 30 for the outer ring. Together the strips are substantially equivalent to a solid magnet where the directions of the flux in each magnet are represented by arrows in FIG. 5 and where the north and south poles of this "solid" magnet are as shown, it being understood that the polarities shown are illustrative and may be reversed, if desired. Rather than employing concentric or stacked strips as shown in FIGS. 5 and 6, a single strip can be tightly wound to provide a spiral configuration which is also very effective. Typically the strips of flexible magnetic tape are oriented ferrite impregnated rubber strips 1/16 inch or ⅛ inch thick, the strips being polarized across the thin dimension thereof as indicated in FIG. 5. Further, rather than tapes, ferrite block magnets (typically 3/16 inch thick) may also be employed to construct a configuration corresponding to that of FIG. 6.

Sputter cathodes magnetically enhanced by the magnetic structures of the present invention possessed superior performance characteristics compared to those enhanced by the conventional FIG. 1 structure. They support extremely high density plasmas, give better than usual target utilization and provide higher power efficiency than conventionally achieved. They need no pole pieces, can be built at lower cost and promise longer maintenance free life time.

The rolled and stacked magnet assemblies differ from the conventional magnetic arrays in that they represent a "solid" magnet, as discussed above, rather than several individual magnets pieced together magnetically via the pole pieces or pole plates. The performance of the resulting cathodes is closely related to this "solid" form—especially in the corners 34 shown in FIGS. 7 and 8. A degree of corner integrity can be readily lost by any gaps between the layers of rubber magnet in the corners. Trying to wind a magnet to best fit a rectangle on the outside and gradually gapping the corners with magnetic material 36 as in FIG. 7 to generate a flattened elipse in the center will typically result in a much less powerful cathode than will a tight wound flattened elipse as shown in FIG. 8.

When the rubber strip is used in either a stacked or rolled construction several new factors are present. As indicated above, there is a unique advantage in establishing the "corner integrity" such that the plasma does not suffer corner losses as typically occurs with stacked block angled corners or square corners. Further, the electrical efficiency of the cathode increases—that is, more sputtering per watt-second of power consumed. Improvement is typically sufficient to give 1.5 to 3 times the usual sputter efficiency. There is also a uniquely greater stability to very high voltages and currents and to very low inert gas pressures. Full power operation is also obtained at pressure 10 times lower than usually required.

The power levels that can be supported by these cathodes at 2 microns of argon—or less, exceeds that previously observed by the inventor. Due to limitations of power supply capability and inability to adequately cool the target, the ultimate limitations imposed by the magnetic structures have not been determined. However, it has been observed that two to four times the usually employed power levels are readily attained without suggestion of a break in the E-I curve.

The flexible magnet materials also make possible many structures that would be most difficult and expensive to achieve in any other way. Even the FIG. 1 type of magnet structure can be given improved properties by interweaved stacking of the corners to provide "corner integrity" using the rubber strips. It may also be possible to achieve the corner integrity by use of permeable metal sheets between layers of blocks or strips in the corner regions.

In spite of the improvements effected by the FIG. 5 embodiments, they still suffer from uneven target utilization. Where the lines of flux enter the center line of the target at about 45° or more, there is no erosion of the target. At the outside edge prediction is less certain, for centrifical force seems to overcome any simple angle value. Full 90° is a safe value; however, this makes it possible to develop clamp rings and guards that stop erosion at any desired point, as will be discussed further hereinafter. The lack of erosion in the target center is of special concern due to the great cost of most of the targets. Increasing the area significantly eroded before any point erodes all the way through the target is thus of great importance. Accordingly, the magnetic structure illustrated in FIG. 9 may be employed whereby the magnets 28 are tipped away from the perpendicular orientation shown in FIG. 5. The angle of the magnets with respect to the perpendicular can fall within the 40°-60° range shown in FIG. 9 and preferably this angle should be 50°-55°. Special orientations of the magnets to change the pattern of erosion become quite easy when the flexible magnet system of the present invention is used. As the magnets are tipped toward the center, it is observed that the plasma is affected very little until approximately 40° is reached. At approximately this angle depending upon the geometrics, field strengths, etc., a unique magnetic fused dome structure is formed at the target center line, the illustration of which is approximate. There appears to become but a single line of perpendicular flux where there had previously been about ½-1 inch or more of this. The flux lines branch out of this center line at angles of 45° or less. The result is a unique plasma flow situation where the opposing streams of plasma overlap the center line of the magnetics, providing erosion of the target across its center whereby the uniformity of target erosion may be improved with respect to that of the FIG. 5 embodiment. Although the magnets 28 as shown in FIG. 9 are polarized across the thin dimension thereof, it is to be understood that they may also be polarized along the width thereof—that is, from A to B as shown in FIG. 9. Of course, to obtain the same field configuration as shown in FIG. 9, the magnets 28 would have to be rotated 90° so that the direction of the flux extending from A to B would be the same as the flux shown in the magnets 28 of FIG. 9.

Figure 10:
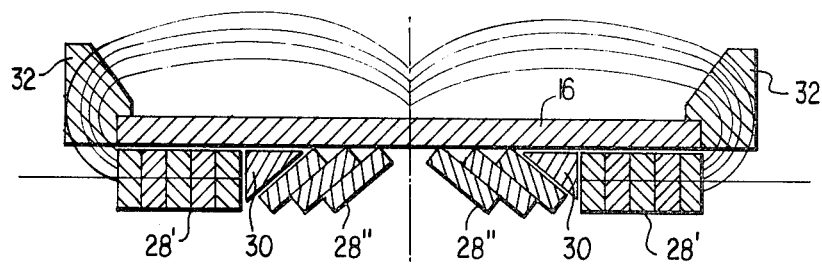

A particularly preferred embodiment of the invention is illustrated in FIG. 10, this embodiment combining the effects provided by the structures of FIGS. 5 and 9. Accordingly with the embodiment of FIG. 10, the strength of the magnetic field above cathode 16 is enhanced by the perpendicular magnets 28' while the erosion of the target center is enhanced by the tipped magnets 28''. Thus, for example, if the cathode has a width of 4 inches to 4¾ inches, the extent of magnets 28'' on one side of the cathode might be ½ inch to ¾ inch, and the extent of magnets 28' might be one inch. To provide a continuous solid structure, a wedge-like insert 30 of magnetically permeable material is preferably disposed between the perpendicular magnets 28' and the tipped magnets 28''. As indicated hereinbefore, clamp rings may be provided to stop erosion at the outer edge of the target. Such a ring is shown at 32 in FIG. 10 where the lines of force are perpendicular to the clamp rings. Further, such clamp rings may be useful in positioning the cathode structure of FIG. 10 within the sputtering device.

Figure 11:
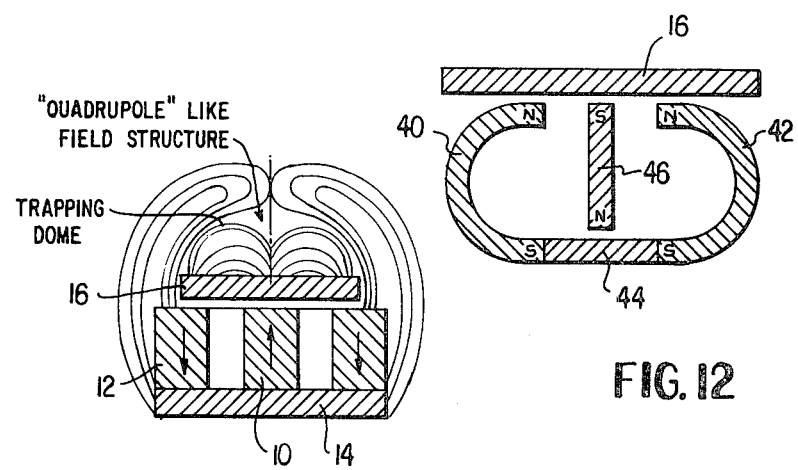
FIG. 11 is an illustrative embodiment of a magnetic structure applicable to small cathodes in accordance with an important aspect of the invention.

An attempt was made to construct very small structures corresponding to that of FIG. 1. It was found that at diameters less than about 1½ inches they would not work in that they would not support a stable magnetically enhanced plasma. At sufficiently high voltage they operated as sputter diodes, with no change in behavior noted in the presence or absence of the magnets. Such a structure is shown in FIG. 11 where the structure corresponds to that shown in FIG. 1 but where the distances between the magnets have been substantially decreased to provide a small sputtering device where the cathode typically has a diameter of one inch or less. Such small devices are useful in many applications.

It is thought the problem of center erosion and the problem of very small targets are one and the same. The radius of curvature for the plasma path may be a problem also. The electrons traveling tight corners need very high magnetic fields to keep them from centrifuging away from the cathode. A one inch diameter cathode as shown in FIG. 11 can be built using the most powerful ferrite magnets, although it is to be understood that the cathode of FIG. 11 may be elongated rather than circular if so desired. Under most conditions this will not perform in a magnetically enhanced mode. An iron filings picture which gives an indication of the positions of the lines of force provides an explanation. The trapping dome is very short, pushed down by strangely shaped lines of force from the outer half of the ring magnet. Making the center magnet stronger would help push up the dome, but the strongest commercially available ferrite are now being used. The dome must clear the target surface by at least ⅛ inch for the magnetic structure to be effective. Because of the quadrupole-like form above the magnet, the dome is very tightly defined. Changes in target height of a few thousandths of an inch change this from an unenhanced cathode to a violently effective enhanced one.

Figure 12:
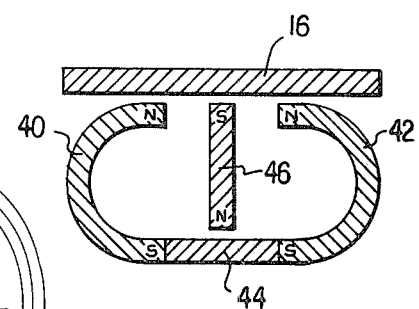
FIG. 12 is a cross-sectional view of a further embodiment of a magnetic structure applicable to small cathodes.

It can thus be seen that the small cathode structure of FIG. 11 has the same general quadrupole-like lines of force as the center effective units of FIGS. 9 and 10 obtained by tipping the magnets. As the small cathode field is reduced, or the cathode dimensions increased, the quadrupole effect becomes undetectable. Other magnetic structures may be employed to effect the quadrupole-like lines of force illustrated in FIGS. 5 and 9. Illustrative of such structures would be that of FIG. 12 which is also particularly applicable to small cathodes of either circular or elongated configuration. The magnetic structure includes a pair of C-magnets 40 and 42 in opposing polarity as shown in FIG. 12 where the polarity may be reversed if so desired. A pole piece 44 connects the lower arms of the magnets 40 and 42. A center magnet 46 is disposed between the magnets 40 and 42 where the polarity of the upper pole thereof is opposite that of the upper arms of the C-magnets and where the magnet 46 may be an extension of pole piece 44, if desired.

It is a general teaching of the FIG. 1 structures that the outer pole area should be approximately the same as the inner pole area. In the structures of FIGS. 9, 10 and 11, this teaching has been totally violated. In tipping the magnets in the FIGS. 9 and 10 structures, the lines of force are projected upward from the outer edges, the return path being closed off down the center. In the smaller structure of FIG. 11, the pole areas are loaded ≃10:1 outside to inside. The results are unique.

Figure 13:
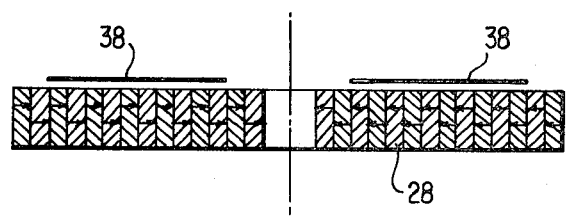
FIG. 13 is a cross-sectional view of an illustrative embodiment of a further, preferred embodiment of the invention.

Placing a steel pole piece in the center and/or around the outside edges of the cathode has almost no effect on the performance of the cathodes of this invention. The unique effects are almost totally caused by the form factor created by the stacking. The form factor can be improved even further (with some loss of flux) through the use of thin magnetic shunts 38 as shown in FIG. 13, which shows thin steel shunts 38 placed just out of magnetic contact with the magnet edge surface. The gauss level parallel to the target surface (about 3/16 inch above the surface seems to be the most meaningful indication) is shown with and without the shunt in FIG. 14. The presence of the correct thickness (typically 0.005-0.015 inch) and width of shunt provides a significantly wider path of maximum erosion. A heavy shunt destroys the pattern.

Figure 14:
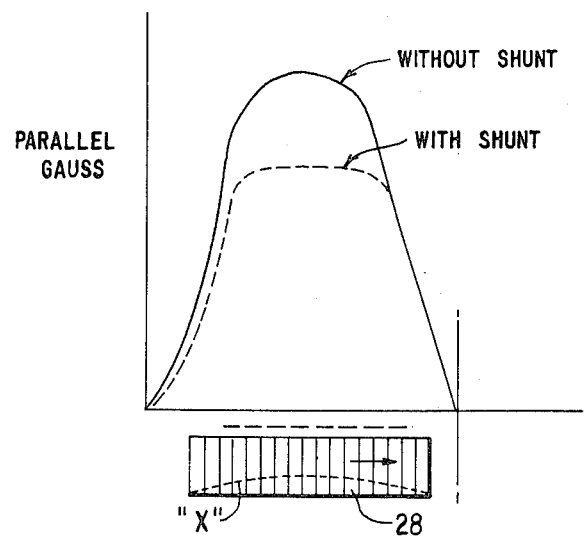
FIG. 14 illustrates (a) a graph showing the flux distribution established by the structure of FIG. 13 and (b) a cross-sectional view of an illustrative embodiment of a further, preferred embodiment of the invention.

Modifying the cross section depth of the magnets can also be used to help shape the parallel gauss curve and thus the erosion pattern indicated at "x" in FIG. 14. Further, there appears to be many ways the stacked and rolled parallel and tipped magnetic structures of the present invention can be varied to influence target utilization and other performance criteria. Combinations of these effects can also be useful.

It should also be noted it has been a consistent teaching of the prior art in the magnetically enhanced sputtering field that it was necessary to provide a continuous line of force loop system to provide significant plasma enhancement, the loop, as stated hereinbefore, being defined in the FIG. 1 embodiment above cathode 16 between inner magnet 10 and outer magnet 12. With the flexible strips of the present invention it can be shown that unique and productive configurations can be assembled that are in opposition to this. In fact, unusually wide and uniform sputtering patterns can be obtained in cases where there is intentional disruption of the "race track" type of pattern. By stacking an inch or more thick of long rubber magnet strips, they can be folded, wound and twisted to explore configurations where the ends do not meet end to end. Especially effective is the configuration where an end butts 90° to a side. At such an intersection (of the correct polarities) the plasma forms a 90° corner—full into the corner——and spreads to the full width of the 45° limits of the line of force pattern. This wide plasma seems to be compressed by negotiating corners—as might be predicted from centrifugal force and continuing acceleration in the corners. Such configurations may lead to increased target utilization and refinements far removed from the prior art.

Reference should now be made to FIGS. 15, 16 and 17, which are cross-sectional views directed to further modifications of the present invention which are stable at extremely low pressures and which have an I-E characteristic that exhibits a zero dynamic impedance in a predetermined band of low pressures. FIG. 15 is a modification of the FIG. 1 embodiment of the prior art. In particular, the portion on the right side of the phantom center line of FIG. 15 corresponds to the new zero dynamic impedance embodiment of the present invention while the left side portion corresponds to an embodiment which provides the normally anticipated infinite dynamic impedance of saturation—that is, positive impedance, as will be discussed in more detail hereinafter. Of course, in implementing the present invention, the left side of FIG. 1 would be the mirror image of the right side thereof. In FIG. 15 at the periphery of the magnetic structure, a first plurality of horizontally disposed magnetic strips 50 are disposed on top of a second plurality of horizontally disposed strips 52 where the strips 52 are wider than strips 50 and where the flux in strips 50 and 52 is substantially perpendicular to the approximate periphery of cathode 16. At the center of the magnetic structure a third plurality of horizontally disposed strips 54 are disposed on top of a fourth plurality of strips 56 where the strips 56 are wider than the strips 54 and where the flux in strips 54 and 56 is substantially perpendicular to the approximate central portion of cathode 16. As indicated in the drawing, the strips 50–56 are polarized across the thin dimension thereof. By widening the center magnet at the base thereof, the magnetic field above cathode 16 is made more parallel to and is brought closer to the surface of the cathode than is the case with the prior art cathode of FIG. 1. The widened base of the outer magnet provides a return for the lines of force emanating from the base of the center magnet. Accordingly, the area of target erosion of the FIG. 15 embodiment is increased with respect to that of the FIG. 1 embodiment. Rather than use the stacked strips of tape as shown in FIG. 15, a solid structure as employed in FIG. 1 may also be used in the embodiment of FIG. 15 or the remaining embodiments where, of course, for the FIG. 15 embodiment, the respective bases of magnets 10 and 12 of FIG. 1 would be widened.

The foregoing arrangement contrasts with the left portion of FIG. 15 where the magnets 10 and 12 are simply replaced with respective stacks of horizontally disposed strips 58 and 60 as shown in the Figure. To obtain the advantages of the present invention, it is necessary to widen the lower layers of the magnetic strips as shown in the right portion of FIG. 15.

Referring to FIGS. 16 and 17, there are illustrated four further embodiments of the invention, which are capable of achieving the zero dynamic impedance of the present invention. In FIG. 16, at the left side portion thereof, there is illustrated a first embodiment wherein centrally disposed tipped strips 28" are surrounded by a plurality of horizontally disposed strips 62 where the flux therein is substantially perpendicular to the approximate periphery of cathode 16. In implementing this embodiment, the right side of FIG. 16 would be the mirror image of the left side thereof. Thus, this first embodiment corresponds somewhat to that of FIG. 10 where the slanted angle of strips 28" would preferably fall within the 40°–60° range discussed hereinbefore with respect to FIG. 9. Further, insert 30 may also be employed if desired although it is not needed if good contact is made between an edge of magnets 28" and magnets 62. The directions of the flux in magnets 28" and 62 are represented by arrows where the north and south poles are as shown, it being understood that the polarities shown for this embodiment and the other embodiments of this invention are illustrative and may be reversed if desired.

The right side portion of FIG. 16 illustrates a second embodiment capable of producing the zero dynamic impedance of the present invention where the vertically disposed strips 28 correspond to those of FIG. 5 and where they are surrounded by horizontally disposed strips 62. In implementing this embodiment, the left side of FIG. 16 would be the mirror image of the right side thereof.

The left side portion of FIG. 17 is a modification of the left side portion of FIG. 16 where, in implementing this embodiment, the right side of FIG. 17 would be the mirror image of the left side thereof. The slanted or tipped magnets 28''' have a generally rectangular cross-section where the widths of the strips at A and B are more narrow than those at C as shown in FIG. 17. A further plurality of vertically disposed strips 64 are disposed between horizontally disposed strips 62 and tipped strips 28''', the flux direction in strips 64 being substantially parallel to the cathode surface.

The right side portion of FIG. 17 illustrates a further embodiment where tipped strips 28" are disposed between horizontally disposed strips 62 and vertically disposed strips 66. Again in implementing this embodiment, the left side of FIG. 17 would be the mirror image of the right side thereof.

As can be seen in FIGS. 16 and 17, a common characteristic of all embodiments is the presence of the outer ring of horizontally disposed strips 62. Preferably the outer edge of strips 62 is disposed slightly inward of the outer edge of cathode 16 although other relative placements are permissible. The strips 62 cause the field on the other side of target 16 to be substantially vertical at the approximate periphery thereof. It is thought that this feature is instrumental in achieving the many advantages associated with not only the embodiments of FIGS. 16 and 17 but also those corresponding to FIG. 15. Increased field strength does not seem to be a contributing factor. These advantages will be discussed in detail hereinafter with respect to FIGS. 21 and 22. However, before doing so, certain characteristics of conventional magnetrons will be discussed with respect to FIGS. 18 through 20.

Figure 18:
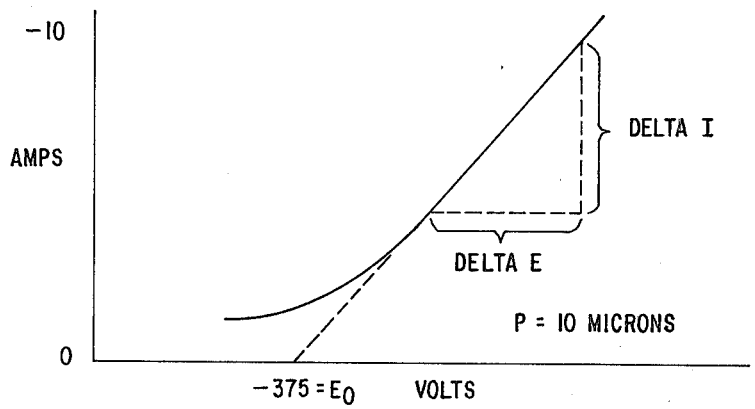
FIG. 18 illustrates a typical current-voltage characteristic for a magnetically enhanced sputter cathode such as that of the embodiment of FIG. 1.

Magnetically enhanced sputter cathodes such as the embodiment of FIG. 1 typically display a current-voltage characteristic such as that shown in FIG. 18. The cathode reaction impedance, Z, may be defined as delta E over delta I at any point along the characteristic. This impedance usually assumes a fixed value above a current of a few amperes. The initiation voltage, $E_o$, may be defined as the zero current intercept of the extrapolated linear portion of the current voltage characteristic.

Figure 19:
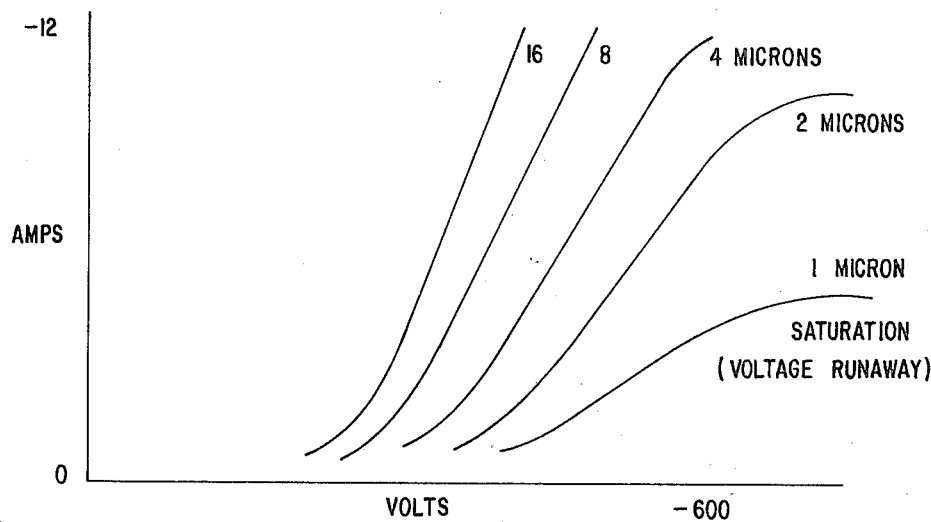
FIG. 19 illustrates a family of current-voltage characteristics corresponding to that of FIG. 18 over a range of pressures.

The family of characteristics over a range of pressures is shown in FIG. 19 for the conventional magnetron. Typically, $Z_p$, the reaction impedance that is constant at a given pressure changes with pressure, becoming larger at lower pressures. The characteristic curves start to break at high power as the pressure is reduced. This is a strong function of magnetic quality, both field strength and corner integrity. With a good magnetic structure, some break will start to occur in the 2 micron argon pressure characteristic. These cathodes can sometimes be operated at pressures as low as one micron, but starting becomes difficult, and the discharge will sometimes pop out. The lower pressure characteristics lean over or break to show a saturation.

Figure 20:
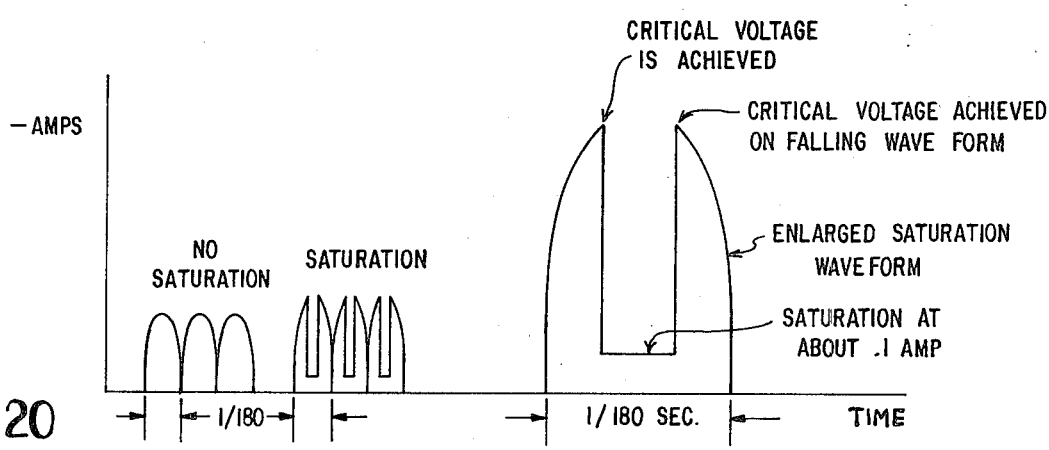
FIG. 20 illustrates current waveforms associated with the characteristics of FIGS. 18 and 19.

The current wave form assumes a most unexpected form, as shown in FIG. 20. The shape of the current peaks at low power is a function of the three phase power. However, when the voltage exceeds some critical value which is a function of many factors, the current drops to a very low value, typically a small fraction of an ampere. This is probably the raw electron emission from the target surface. The mechanism of this current loss is not known for certain, but sputtering stops during this period. As soon as the voltage drops below this critical value the current starts again, and follows the wave form as before.

Figure 21:
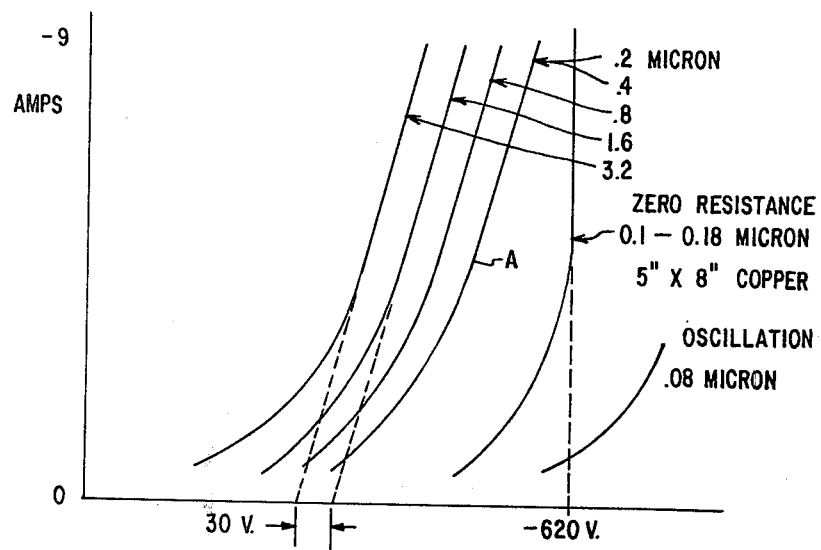
FIG. 21 illustrates a family of current-voltage characteristics over a range of pressures typical of the magnetic structures of FIGS. 15-17.

Characteristics typical of the new cathode magnetic structures of FIGS. 15, 16 and 17 are shown in FIG. 21. Several very interesting differences become obvious. The characteristic is stable to extremely low pressures. A factor of 10× lower pressures becomes very practical. This has many meaningful advantages. Sticking is better. Target to substrate distance becomes a less critical factor. Good sticking has been obtained at 18 inches. Also this expanded pressure range makes it possible to measure and control the pressure with an ionization gauge, rather than the conventional thermocouple gauge. This gives better sensitivity, better repeatability, and much faster response. In addition, most pumping systems, such as that diagrammatically indicated at 68 in FIG. 16, can operate under an argon load without interposing a baffle, or valve restriction at this decreased value. This larger pumping speed gives better impurity removal and more simple system design. Further, there is reduced argon (or other inert gas) entrapment in the coating. Because of the order-of-magnitude decrease in the operating argon pressure over the conventional magnetron, there should be an equivalent decrease in entrapment. The entrapment proves to be even less than that, however, due to the increased coating particle energy resulting from fewer enroute collisions. Thus, as stated above, the sticking is also improved due to this same mechanism. Rate effects, as will be further discussed hereinafter, are also improved where a factor of four times the conventionally obtained rates seems feasible. In this new mode of operation, it is also noted the erosion pattern spreads across the center of the target, providing increased area of target erosion. This rate in the center is less than in the main ring, but does represent significant improvement.

Figure 22:
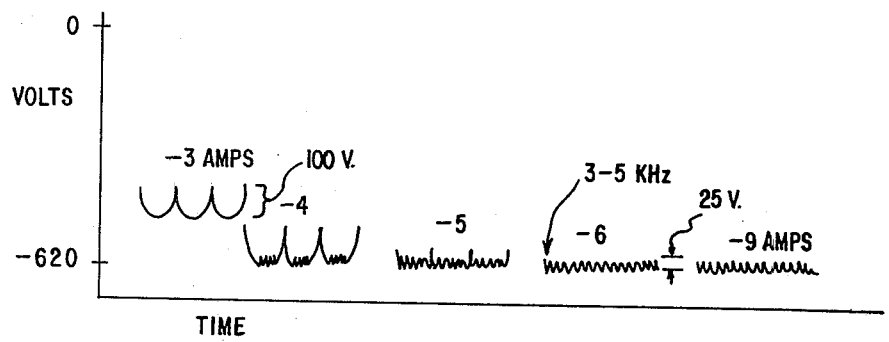
FIG. 22 illustrates various voltage ripple waveforms which occur as the zero impedance portion of the characteristic curves of FIG. 21 is entered.

It is noted $Z_p$ tends to be constant with the structures of FIGS. 15, 16 and 17, independent of pressure over a wide range of pressure. This suggests that the mechanism of the cathode reaction is not changing over this range. The $E_o$ change for each doubling of pressure is constant at about 30 volts over a wide range of pressures. Below about 6.5 microns $E_o$ stops changing, putting the 0.25 micron characteristic on top of the 0.5 micron characteristic as indicated by curve A of FIG. 21. At a pressure of about 0.18 microns, a new effect occurs in the characteristic. It starts to break upward—just the opposite of saturation. Thus, a vertical characteristic, $Z_p=0$, occurs. This does not degenerate into an arc, in that the critical voltage is needed to sustain the low impedance reaction. It is thought this means that at the critical voltage a state is achieved in which the reaction generates as much of the plasma contents as is used. Thus, no voltage drop is involved, and current control while maintaining the critical voltage becomes the new requirement on the power supply. Operation down to 0.07 microns has been achieved, but appreciable currents at these pressures are presently blocked by rather major oscillations in the current and voltage. The voltage ripple is shown in FIG. 22 as the zero impedance portion of the characteristic is entered.

A most important characteristic of the new cathode structures of FIGS. 15, 16 and 17 is a very high sputter rate. Rates at all power levels appear to be enhanced by 50 to 100%. In the zero impedance mode the rates are further enhanced to give as much as 400% of the conventional rate at the same power level. In the lower pressure range there appears to be a greater diffusivity of the plasma, resulting in better target utilization.

What is claimed is:

1. In a planar magnetron sputtering device including a cathode of target material having a planar sputtering surface, at least a portion of which is disposed about a center line perpendicular to said surface, an anode adapted for establishing an accelerating electric field between said anode and cathode, and magnetic means for establishing a magnetic field adjacent the planar sputtering surface of said cathode for lengthening the path traveled by electrons removed from said cathode, and wherein the lines of force of the magnetic field extend over the sputtering surface of said cathode and pass through the cathode in the vicinity of said center line, the improvement where said magnetic means includes first magnet means for causing a majority of said magnetic lines of force to pass through said cathode in the vicinity of said center line at angles of 45° or less with respect to said planar surface to thereby enhance the uniformity of cathode erosion and where said magnetic means includes further magnet means for causing the magnetic lines of force to be substantially perpendicular to said sputtering surface of the cathode at the approximate periphery thereof.

2. The improvement as in claim 1 where said first magnet means includes means for causing substantially all of said magnetic lines of force to pass through said cathode in the vicinity of said center line at angles of 45° or less.

3. The improvement as in claims 1 or 2 where said further magnet means includes a first plurality of horizontally disposed strips of magnetized tape disposed on the side of said cathode opposite said planar sputtering surface where each strip is in substantial contact with and at least partially overlaps at least one of the strips adjacent it so that a first magnetic structure is formed by said first plurality of strips, the direction of the flux through said horizontally disposed strips being substantially perpendicular to said approximate periphery of the cathode to thereby cause said magnetic lines of force which are perpendicular to said sputtering surface of the cathode at the approximate periphery thereof.

4. The improvement as in claim 3 where said first plurality of strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

5. The improvement as in claim 3 where said first magnet means includes a second plurality of strips of magnetized tape disposed on the side of said cathode opposite said planar sputtering surface where each strip is in substantial contact with and at least partially overlaps at least one of the strips adjacent it and where at least some of the strips near the vicinity of said center line of the cathode are disposed at an angle of 40°-60° with respect to the perpendicular to said planar sputtering surface so that a second magnetic structure is formed by said second plurality of strips, the second magnetic structure extending toward said center line and parallel to said planar sputtering surface and said first plurality of strips is further removed from said center line than said second plurality of strips along a line substantially parallel to said planar sputtering surface of the cathode.

6. The improvement as in claim 5 where said angle is 50°-55°.

7. The improvement as in claim 5 where said second plurality of strips extends substantially to the center line of the cathode.

8. The improvement as in claim 5 where said second plurality of strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

9. The improvement as in claim 5 where said first magnet means includes a third plurality of vertically disposed strips of magnetized tape disposed on the side of said cathode opposite said planar sputtering surface where each strip is in substantially contact with and at least partially overlaps at least one of the strips adjacent it so that a third magnetic structure is formed by said third plurality of strips, the direction of the flux through said vertically disposed strips being substantially parallel to the planar sputtering surface of the cathode.

10. The improvement as in claim 9 where said third plurality of vertically disposed strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

11. The improvement as in claim 9 where said third plurality of vertically disposed strips is further removed from said center line than said second plurality of strips along said line substantially parallel to the planar sputtering surface of the cathode.

12. The improvement as in claim 9 where said second plurality of strips is further removed from said center line than said third plurality of vertically disposed strips along said line substantially parallel to the planar sputtering surface of the cathode.

13. The improvement as in claim 3 where said first magnet means includes a second plurality of vertically disposed strips of magnetized tape disposed on the side of said cathode opposite said planar sputtering surface where each strip is in substantial contact with and at least partially overlaps at least one of the strips adjacent it so that a second magnetic structure is formed by said second plurality of strips, the direction of the flux through said second plurality of strips being substantially parallel to the planar sputtering surface of the cathode and said first plurality of strips is further removed from said center line than said second plurality of strips along a line substantially parallel to the sputtering surface of the cathode.

14. The improvement as in claim 13 where said second plurality of vertically disposed strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

15. The improvement as in claim 1 including pumping means for operating said planar magnetron sputtering device at a pressure less than two microns.

16. In a planar magnetron sputtering device including a cathode of target material having a planar sputtering surface, at least a portion of which is disposed about a center line perpendicular to said surface, an anode adapted for establishing an accelerating electric field between said anode and cathode, and magnetic means for establishing a magnetic field adjacent the planar sputtering surface of said cathode for lengthening the path traveled by electrons removed from said cathode, and wherein the lines of force of the magnetic field extend over the sputtering surface of said cathode and pass through the cathode in the vicinity of said center line, the improvement where said magnetic means includes a first plurality of horizontally disposed strips of magnetized tape disposed on the side of said cathode opposite said planar sputtering surface where each strip is in substantial contact with and at least partially overlaps at least one of the strips adjacent it so that a first magnetic structure is formed by said first plurality of strips, the direction of the flux through said horizontally disposed strips being substantially perpendicular to the approximate periphery of the sputtering surface of the cathode to thereby cause said magnetic lines of force to be perpendicular to said cathode at the approximate periphery thereof.

17. The improvement as in claim 16 where said first plurality of horizontally disposed strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

18. The improvement as in claim 16 where said magnetic means includes a second plurality of strips of magnetized tape disposed on the side of said cathode opposite said planar sputtering surface where each strip is in substantial contact with and at least partially overlaps at least one of the strips adjacent it and where at least some of the strips near the vicinity of said center line of the cathode are disposed at an angle of 40°–60° with respect to the perpendicular to said planar sputtering surface so that a second magnetic structure is formed by said second plurality of strips, the second magnetic structure extending toward said center line and parallel to said sputtering surface and said first plurality of strips is further removed from said center line than said second plurality of strips along a line substantially parallel to said planar sputtering surface of the cathode.

19. The improvement as in claim 18 where said angle is 50°–55°.

20. The improvement as in claim 18 where said second plurality of strips substantially extends to the center line of the cathode.

21. The improvement as in claim 18 where said second plurality of strips of magnetized tape has a coil-like configuration where each turn of the coil is in substantial contact with and at least partially overlaps at least one of the turns adjacent it so that a, flat coil is formed by said wound strip, the coil being parallel to said planar surface and disposed substantially symmetrical with respect to said center line.

22. The improvement as in claim 18 where said magnetic means includes a third plurality of vertically disposed strips of magnetized tapes disposed on the side of said cathode opposite said planar sputtering surface where each strip is in substantial contact with and at least partially overlaps at least one of the strips adjacent it so that a third magnetic structure is formed by said third plurality of strips, the direction of the flux through said vertically disposed strips being substantially parallel to the planar sputtering surface of the cathode.

23. The improvement as in claim 22 where said third plurality of vertically disposed strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

24. The improvement as in claim 22 where said third plurality of strips is further removed from said center line than said second plurality of strips along said line substantially parallel to the planar sputtering surface of the cathode.

25. The improvement as in claim 22 where said second plurality of strips is further removed from said center line than said third plurality of strips along said line substantially parallel to the planar sputtering surface of the cathode.

26. The improvement as in claim 16 where said magnetic means includes a second plurality of vertically disposed strips of magnetized tape disposed on the side of said cathode opposite said planar sputtering surface where each strip is in substantial contact with and at least partially overlaps at least one of the strips adjacent it so that a second magnetic structure is formed by said second plurality of strips, the direction of the flux through said second plurality of vertically disposed strips being substantially parallel to the planar sputtering surface of the cathode and said first plurality of strips is further removed from said center line than said second plurality of strips along a line substantially parallel to the planar sputtering surface of the cathode.

27. The improvement as in claim 26 where said second plurality of vertically disposed strips of magnetized tape has a coil-like configuration where each turn of the coil is in substantial contact with and at least partially overlaps at least one of the turns adjacent it so that a flat coil is formed by said wound strip, the coil being parallel to said planar sputtering surface and disposed substantially symmetrical with respect to said center line.

28. The improvement as in claim 16 including pumping means for operating said planar magnetron sputtering device at a pressure less than two microns.

29. In a planar magnetron sputtering device including a cathode of target material having a planar sputtering surface, at least a portion of which is disposed about a center line perpendicular to said surface, an anode adapted for establishing an accelerating electric field between said anode and cathode, and magnetic means for establishing a magnetic field adjacent the planar sputtering surface of said cathode for lengthening the path traveled by electrons removed from said cathode, and wherein the lines of force of the magnetic field extend over the sputtering surface of said cathode and pass through the cathode in the vicinity of said center line, the improvement where said magnetic means includes first and second magnets separated from one another and connnected by at least one pole piece, said first magnet being approximately disposed along said center line, the width of said first and second magnets being substantially greater at the respective base portions thereof connected to said pole piece than the respective upper portions thereof adjacent said cathode.

30. The improvement as in claim 29 including pumping means for operating said planar magnetron sputtering device at a pressure less than two microns.

* * * * *